United States Patent
Jochym et al.

(10) Patent No.: US 6,678,874 B1
(45) Date of Patent: Jan. 13, 2004

(54) COMPUTER-AIDED DESIGN (CAD) TOOL

(75) Inventors: Daniel A. Jochym, Downington, PA (US); Joseph N Closs, Philadelphia, PA (US)

(73) Assignee: Unisys Corporation, Blue Bell, PA (US)

( * ) Notice: Subject to any disclaimer, the term of this patent is extended or adjusted under 35 U.S.C. 154(b) by 43 days.

(21) Appl. No.: 09/997,025

(22) Filed: Nov. 28, 2001

(51) Int. Cl.$^7$ .............................................. G06F 17/50
(52) U.S. Cl. ................... 716/11; 716/8; 716/9; 716/10
(58) Field of Search ........................ 716/1–14

(56) References Cited

U.S. PATENT DOCUMENTS

| | | | | |
|---|---|---|---|---|
| 5,109,479 A | * | 4/1992 | Williams | .................... 345/582 |
| 5,111,362 A | * | 5/1992 | Flamm et al. | ............... 361/736 |
| 5,666,516 A | * | 9/1997 | Combs | ........................ 711/163 |
| 5,825,630 A | * | 10/1998 | Taylor et al. | ............... 361/790 |
| 6,173,358 B1 | * | 1/2001 | Combs | ........................ 711/100 |

* cited by examiner

*Primary Examiner*—Matthew Smith
*Assistant Examiner*—Sun James Lin
(74) *Attorney, Agent, or Firm*—Michael B. Atlass; Mark T. Starr; Woodcock Washburn

(57) ABSTRACT

A computer aided design (CAD) tool takes into account system-level design parameters by considering data from a number of printed circuit board (PCB)-related data files. In one embodiment, the CAD tool takes into account signal path length at the system-level for a computer system comprising more than one PCB. In another embodiment, the CAD tool provides a three-dimensional display for showing how at least one signal path traverses the computer system in going from one PCB to another PCB.

16 Claims, 22 Drawing Sheets

FIG. 7 package length information file 665-1

306 - units

307 – number of pins $p$

308 – pin array [pin identifier, equivalent length] number of rows is $p$,

FIG. 9 connector length information file 665-2

406 - units

407 – number of rows of pins $r$

408 – row array [row identifier, equivalent length] number of rows is $r$,

FIG. 11 board layup file 660

451 - layer
452 – thickness
453 – layer number
454 – layer name
455 – line width
456 – impedance
457 – summary information

FIG. 13 system configuration file 655

101 - connecting-board name, comprising:
    102 – board list,
    103 – connector map file name,
    104 – netsfile name,
    105 – board layup file name of connecting-board, 103-1 – board type,

• • •

103-k – board type,

FIG. 14 system configuration file 655 (continued)

102 - board list
    102-1 - board type, connector group, pin depth, identifier;
    102-2 - board type, connector group, pin depth, identifier;
    • • •
    102-j - board type, connector group, pin depth, identifier;

103-*i* – for each board type, board information comprising one or more of the following:

connector group, pin depth, identifier,
    length information filename(s), identifier,
    board layup filename,
    • • •

FIG. 16 netslist file 670

471 – group name

472 – signal list

FIG. 20 portion of VRML wires file 690-1

```
#VRML V2.0 utf8
PROTO Line [
    field SFVec3f    lineSize       0.0 0.0 0.0
    field SFVec3f    lineLocation   0.0 0.0 0.0
    field SFRotation lineAngle      0.0 0.0 1.0 0.0
]{
    Transform {
        translation IS lineLocation
        rotation IS lineAngle
        children [
            Shape {
                appearance Appearance {
                    material Material {
                        emissiveColor 0.0 1.0 1.0
                    }
                }
                geometry Box {
                    size IS lineSize
                }
            }
        ]
    }
}

# <cas_clk> </CLOCK_OK_STS>
Line {
    lineLocation  0.4156  5.0354  -0.0606
    lineSize      0.0087  0.0060   0.0012
    lineAngle     0.0000  0.0000   1.0000  0.0000
}
```

Macro Definition 690-2 signal (net)
board x ......▶
y ......▶
z ......▶

US 6,678,874 B1

COMPUTER-AIDED DESIGN (CAD) TOOL

FIELD OF THE INVENTION

This invention relates generally to the design of computer systems and, more particularly, to computer aided design (CAD) tools.

BACKGROUND OF THE INVENTION

A printed circuit board (PCB) (also referred to as a printed wiring board (PWB), or a PC Laminate (PC Lam)) provides a mechanism for implementing a circuit design (i.e., the interconnection of electrical devices and components) for use, e.g., in the design of a computer system. A PCB may be "single layer," "double layer," or "multi-layer"—each of which refers to the number of electrically conductive layers. A multi-layer board bonded together. Typically, holes (or through-holes) are drilled through a PCB and are subsequently coated, or plated, with a conductive substance (forming "vias") for the purpose of connecting signal paths on different conductive layers together.

In designing a PCB, both component placement (layout) and signal path routing must be determined. While for simple designs this may be performed manually—for complex PCB designs, e.g., where the number of components is large and the number of signals number in the hundreds—the layout and signal path routing becomes more, and more, tedious. To this end, and as known in the art, computer-aided design (CAD) tools can be used to assist in performing the layout and signal routing for a PCB. A CAD tool typically provides for a PCB design a board-related data file comprising at least component placement and signal path routing information.

SUMMARY OF THE INVENTION

We have observed that in the design of high-performance computer systems comprising a number of PCBs, there are system-level design parameters that should be taken into account in the design of an individual PCB for use in the computer system. In this context, we have realized that the above-mentioned CAD tools are PCB-focused—they do not address these system-level design parameters. Consequently, it may subsequently be discovered that an existing PCB—one already designed and manufactured—in fact contributes to the computer system exceeding a system-level design parameter—with the result that the existing PCB may have to be manually re-worked and/or re-designed.

Therefore, and in accordance with the invention, in designing a computer system comprising a number of PCBs, a CAD tool generates data files, or output files, for each of the PCBs and processes the PCB data files for taking into account a system-level design parameter.

In an embodiment of the invention, a CAD tool takes into account signal path length at the system-level for a computer system comprising N PCBs, where N>1. In particular, the CAD tool processes at least N board-related data files comprising layout, layup and signal path routing information for each PCB for determining if a system-level requirement for overall signal path length is met for at least one signal path.

In another embodiment of the invention a CAD tool takes into a physical orientation of signal paths as the signal paths traverse a computer system comprising N PCBs, where N>1. In particular, the CAD tool processes at least N board-related data files comprising layout and signal path routing information for each PCB for creating a three-dimensional (3D) picture for showing how at least one signal path traverses the computer system in going from one PCB to another PCB.

BRIEF DESCRIPTION OF THE DRAWING

FIGS. 7–17 show illustrative file formats in accordance with the principles of the invention;

FIG. 20 shows an illustrative file format in accordance with the principles of the invention;

DETAILED DESCRIPTION

Other than the inventive concept, the various elements and steps described below and shown in the figures are well known and will not be described herein. It should also be noted that the inventive concept is described in the context of a computer system comprising a number of PCBs. However, the details of the computers system and the PCBs are irrelevant to the invention and, as such, are not described herein. The term "computer program product" represents any mechanism for storing a computer program, e.g., a floppy diskette; a CD-ROM; a file, or files, in compressed and/or uncompressed from, representing the computer program; etc. The term "machine" refers to any stored-program-control processor-based equipment, e.g., a personal computer, work station, etc. The inventive concept is implemented using conventional programming techniques, which are also not described herein.

Figure 1:
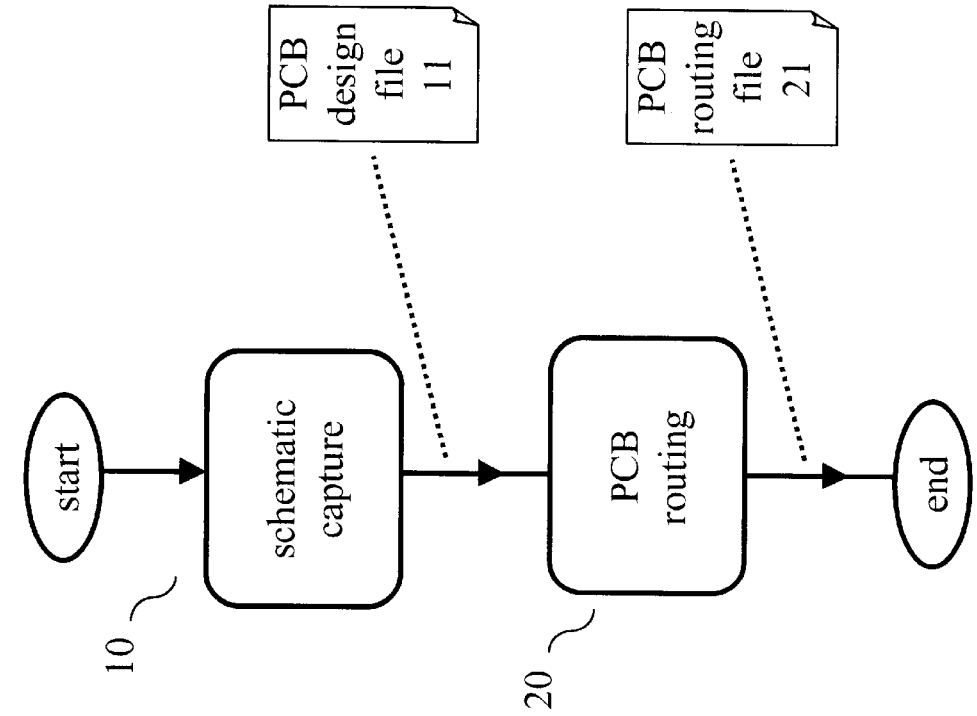
FIG. 1 shows a high-level flow chart of a prior art PCB design approach using CAD tools.
Figure 2:
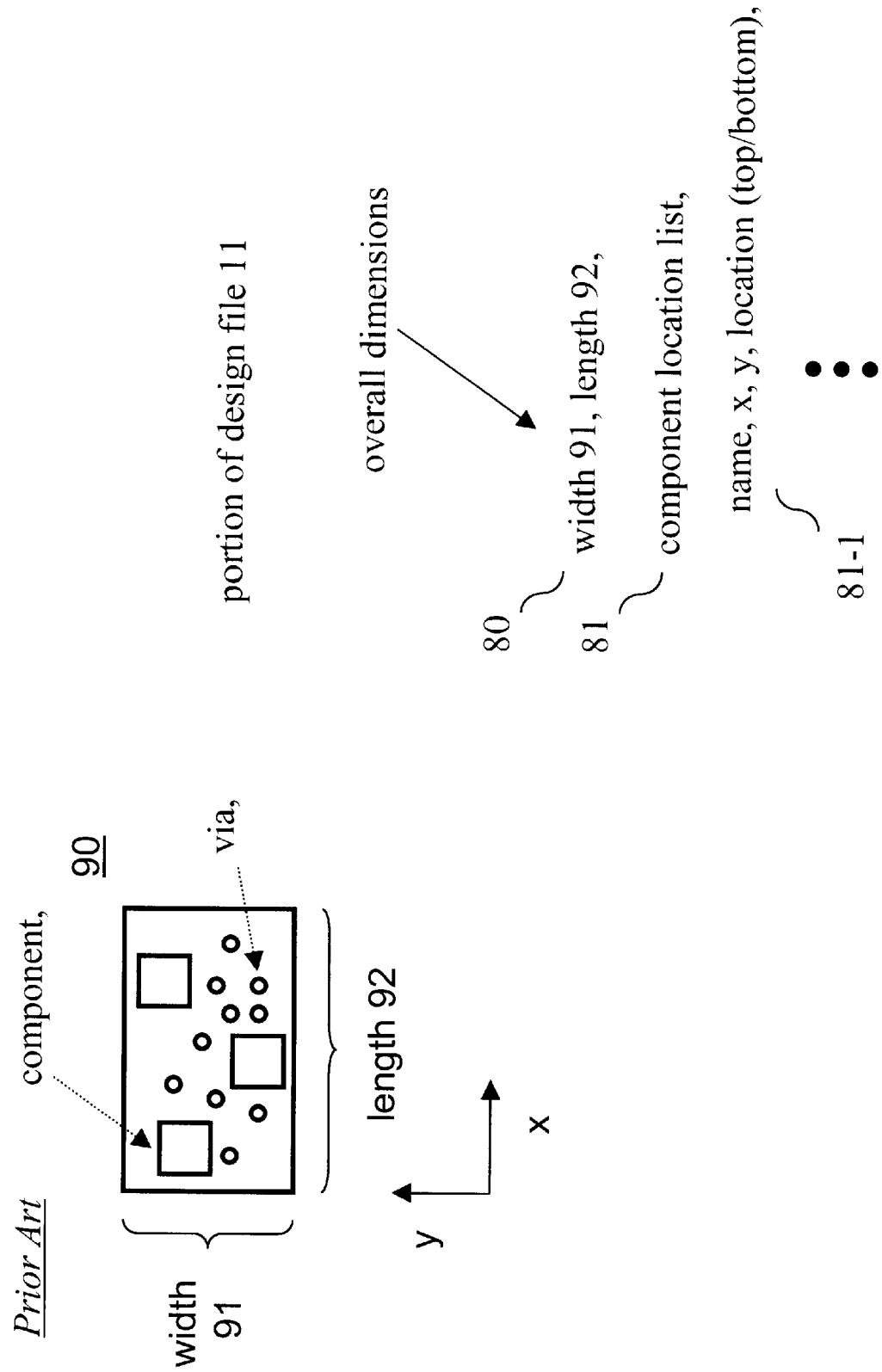
FIG. 2 shows illustrative prior art file information found in a design-type file.

FIG. 1 shows an illustrative high-level flow chart of an existing PCB design approach using CAD tools for an illustrative computer system (not shown) comprising a number of PCBs (not shown). (Some currently available CAD tools for use in FIG. 1 are: Cadence Concept®, Cadence Allegro®, Cadence SPECCTRA®, and the CAD tool suite Mentor Graphics Board Station®.) In step 10, a schematic (not shown) of a PCB design is captured for performing operations such as physical board definition (e.g., the number of layers, thickness, etc.) and component placement (physical layout). As a result of step 10, one or more output files are produced as represented by PCB design file 11. The latter typically includes such items as the physical shape of the board (length and width), component placement, etc. This is illustrated in FIG. 2 for PCB 90 having a length 92, width 91 and comprising some illustrative components (as represented by the squares) and vias (as represented by the circles). A portion of design file 11 comprises overall dimensions information 80 and a component location list 81, which identifies each component on the PCB (by a predefined name), its x and y location (with respect to a predefined reference point, e.g., the lower left corner of the PCB), and what surface of the PCB the component is located on (e.g., top or bottom). Typically, this output file is in an ASCII (American Standard Code for Information Interchange) format.

Figure 3:
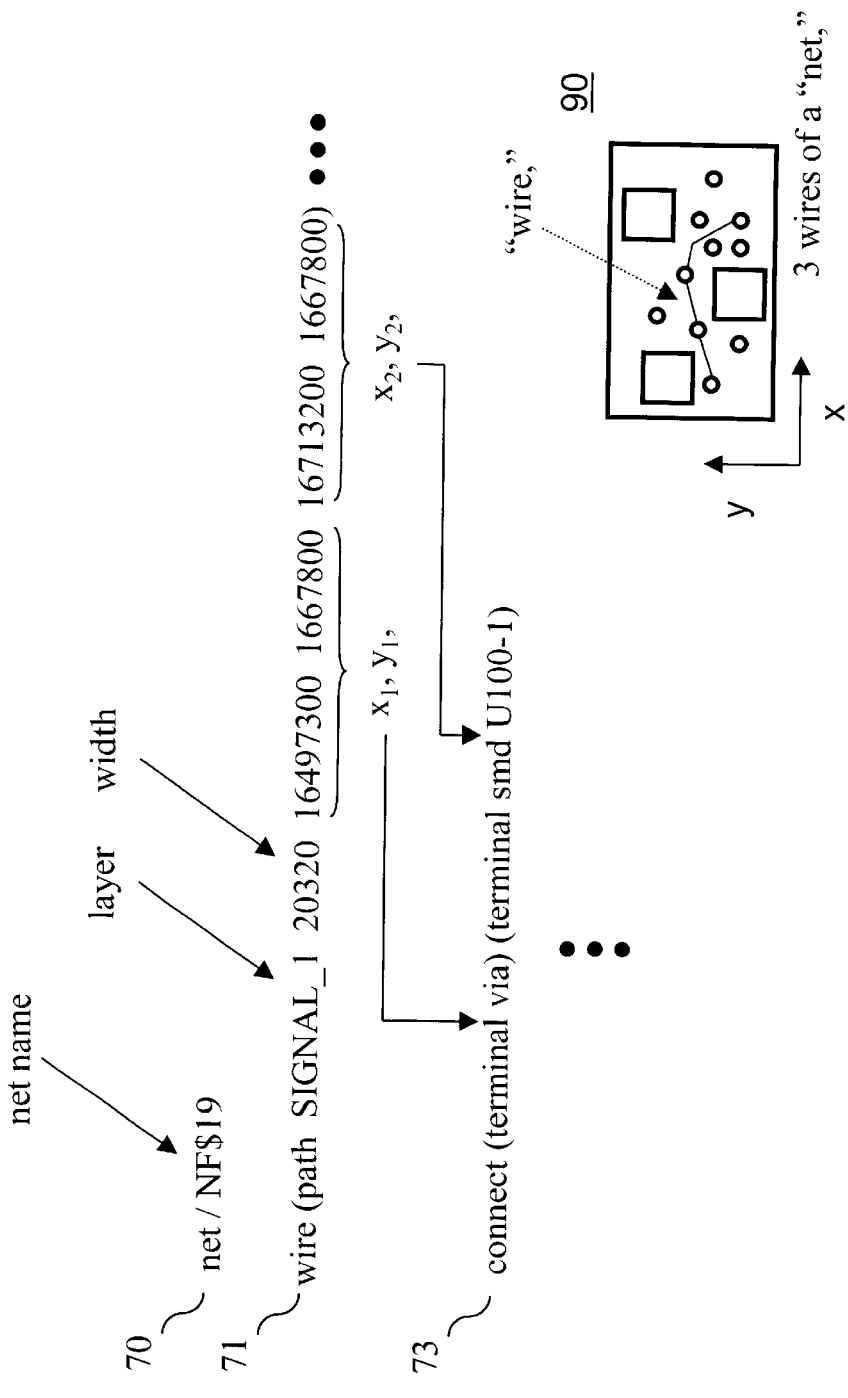
FIG. 3 shows illustrative prior art file information found in a routing-type file.

Returning to FIG. 1, routing for the signal paths on the PCB is performed in step 20. Like step 10, step 20 produces one or more output files as represented by PCB routing file 21. The latter (like PCB design file 11) is typically in an ASCII format. Routing file 21 provides a two-dimensional view of the signal path routing on each layer of the PCB for each signal. As such, routing file 21 includes "net" and "wire" information for each signal on the PCB. (In the art, a "net" is associated with each signal and is represented by a predefined name (i.e., the signal name). A net comprises a number of "wires," where each wire can be thought of as representing the actual signal path between components and/or vias on a particular layer of the PCB. This is illustrated in FIG. 3 on PCB 90, where 3 "wires" of a "net" are shown. In this example, each wire is between two vias. Thus, a "net" is the total series of wires across all layers of the PCB for a particular signal.) An illustration of information typically found in a routing file is shown in FIG. 3. For each net, there is net name information 70, in this illustration a signal named "NF$19." Further, each net comprises wire information 71, which lists, for each wire, the layer this particular signal path is on (here the layer associated with the name "SIGNAL__1") the width of the trace (or etching), and a sequence of x, y coordinates that trace the path of the wire (in this example, only two pairs of x, y coordinates are shown). As known in the art, dimension information is provided in routing file 21 in, e.g., tens of nanometers. Also included for each wire is connect field 73, which identifies, for the starting and ending x, y pairs of wire information 71, the type of connection for this wire (in this example, between a via and a surface mount device (smd) identified as U100-1).

(It should be noted that either, or both, steps 10 and 20 may be iterative in nature. For example, it may be the case that step 20 cannot route particular signals given a particular component placement on the PCB as represented in PCB design file 11. In this case, component placement may have to be altered again in step 10, thus producing a new PCB design file 11 for use in another pass through step 20 for routing the signals.) We have observed that in the design of high-performance computer systems comprising a number of PCBs, there are system-level design parameters that should be taken into account in the design of an individual PCB for the system. In this context, we have realized that the above-mentioned CAD tools are PCB-focused, i.e., each PCB output file, such as PCB routing file 21, is specific only to that particular PCB. Consequently, it may subsequently be discovered that an existing PCB—e.g., one already designed and manufactured according to PCB routing file 21—in fact contributes to the computer system exceeding a system-level design parameter—with the result that the existing PCB may have to be manually re-worked and/or re-designed. Therefore, and in accordance with the invention, in designing a computer system comprising a number of PCBs, a CAD tool generates output files for each of the PCBs and processes the PCB output files for taking into account a system-level design parameter. Thus, if one or more PCB output files cause the resulting system to exceed a system-level design requirement—this may be detected earlier in the design process—before any PCBs are actually built.

Before describing a more complex form of the invention, a simpler form is first presented. In an embodiment of the invention, a CAD tool takes into account signal path length at the system-level for a computer system comprising N PCBs, where N>1. In particular, the CAD tool processes at least N board-related data files comprising layout and signal path routing information for each PCB for determining if a system-level requirement for overall signal path length is met for at least one signal. (It should be observed that overall signal path length for the computer system may be of critical importance because of concerns related, but not limited to, time delay (signal propagation), signal rise times, electrical impedance matching, etc. For example, a particular signal bus (e.g., an address bus) may have a maximum allowed signal path length, which corresponds to a maximum allowed time delay. (Conversion of a time delay into equivalent signal path length is known in the art and not described herein.) As another example of a system-level parameter, a signal bus (i.e., a group of signal paths) may have a requirement that the lengths of each composite signal path be within, e.g., one thousandth of an inch, of each other.

Figure 4:
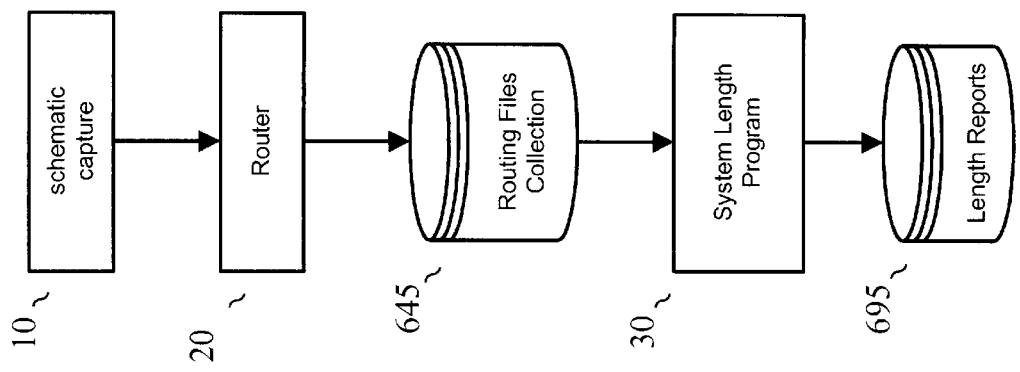
FIG. 4 shows an illustrative diagram embodying the principles of the invention.

Turning now to FIG. 4, an illustrative diagram embodying the principles of the invention is shown. Like numbers indicate like elements and will not be described further. Turning first to steps 10 and 20 (as described above), for each of the N PCBs of the computer system a routing file is produced resulting in a routing files collection 645. These files are processed by system length program 30 (described below), which produces length report files 695.

Figure 5:
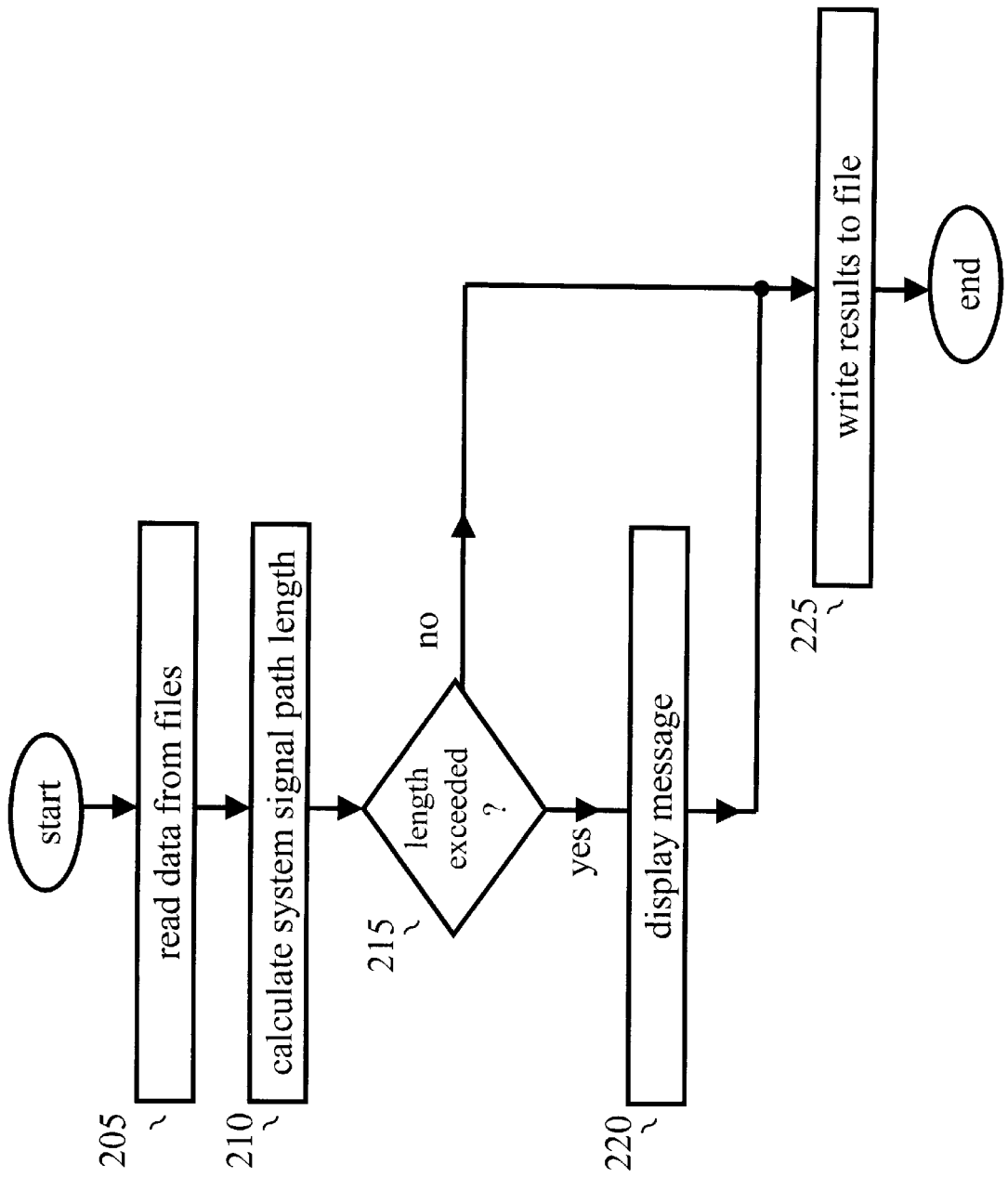
FIG. 5 shows an illustrative flow chart in accordance with the principles of the invention.

An illustrative flow chart for use in system length program 30, and embodying the principles of the invention, is shown in FIG. 5. It is assumed that system length program 30 executes on, e.g., a work station. It should be recalled that a PCB routing file comprises net information for each signal on the PCB. For the purposes of this description, it is assumed that identical signals have identical signal (net) names on each PCB of the computer system. Thus, a signal (net) name of "clock__1" in the routing file of one PCB would also appear in the routing file of other PCBs of the system that use that clock signal. (Alternatively, an ASCII map file could be created a priori identifying the different signal path names on each PCB that, in actuality, correspond to the same signal.) In step 205, data from the above-mentioned routing files collection is read into, e.g., a memory of a work station (not shown in FIG. 5). In step 210, system length program 30 steps through the data (i.e., processing data associated with each PCB) to calculate a PCB-specific signal path length for each net on each PCB using the associated wire information (the sequence of x, y coordinates). (Note, if the routing files coordinates are provided in tens of nanometers, a suitable conversion can be performed.) System length program 30 thus determines for each PCB a collection of signal (net) names and their associated PCB-specific signal path lengths. Then, for those signal names that are identical across the PCBs, those PCB-specific signal path lengths are combined to provide a system-level signal path length across the computer system. (For example, assume a signal, NF$19, appears on a PCB 90 and a PCB 95. First, for PCB 90, the total PCB signal path length of NF$19 on PCB 90 is calculated and, then, for PCB 95 the total PCB signal path length of NF$19 on PCB 95 is calculated. The total system length for NF$19 is then determined by adding the PCB 90 signal-path length calculation for NF$19 to the PCB 95 signal-path length calculation for NF$19. As will be seen below, the calculation using the embodiment of FIG. 4 is a rough approximation of the system signal path length for a signal. Continuing with this example, step 215 checks if any signal exceeds its predefined maximum system length. (The latter is determined empirically for a particular system design, or from, e.g., device manufacturers specifications for particular signals (e.g., via time delay requirements). Thus, different signals may have different associated predefined maximum lengths. Such a table of predefined maximum length values and associated signal names is stored in a memory (not shown) for use by system length program 30.) If a signal is determined to exceed its associated predefined maximum system length in step 215, then a suitable error message (e.g., identifying the signal, its length by PCB, its system length, and the predefined maximum system length for that signal) is displayed in step 220 (e.g., on a display of the work station). (If a system-level parameter, such as length, is exceeded, then, e.g., a particular PCB design can be altered to change the routing and the above-mentioned process repeated.) In either event, a length report file 695 is provided in step 225, where the length report lists, e.g., for each signal (net) name the associated rough approximation of system signal path length. (Suitable exception handling can be added to system length program 30 to handle, e.g., those signals for which there is no limitation to system signal path length, etc.) It should be observed that although a system-level signal path length was illustrated above, other alternatives are possible. For example, time delays can be directly associated with signals and, instead of checking if electrical lengths are exceeded, equivalent calculations can be performed in the time domain such that, in step 215, a calculated time delay for a signal is compared to a predefined time delay limit. Similarly, the flow chart of FIG. 5 can be modified to include checking for signal path length tolerances in a signal bus (as mentioned above).

Figure 6:
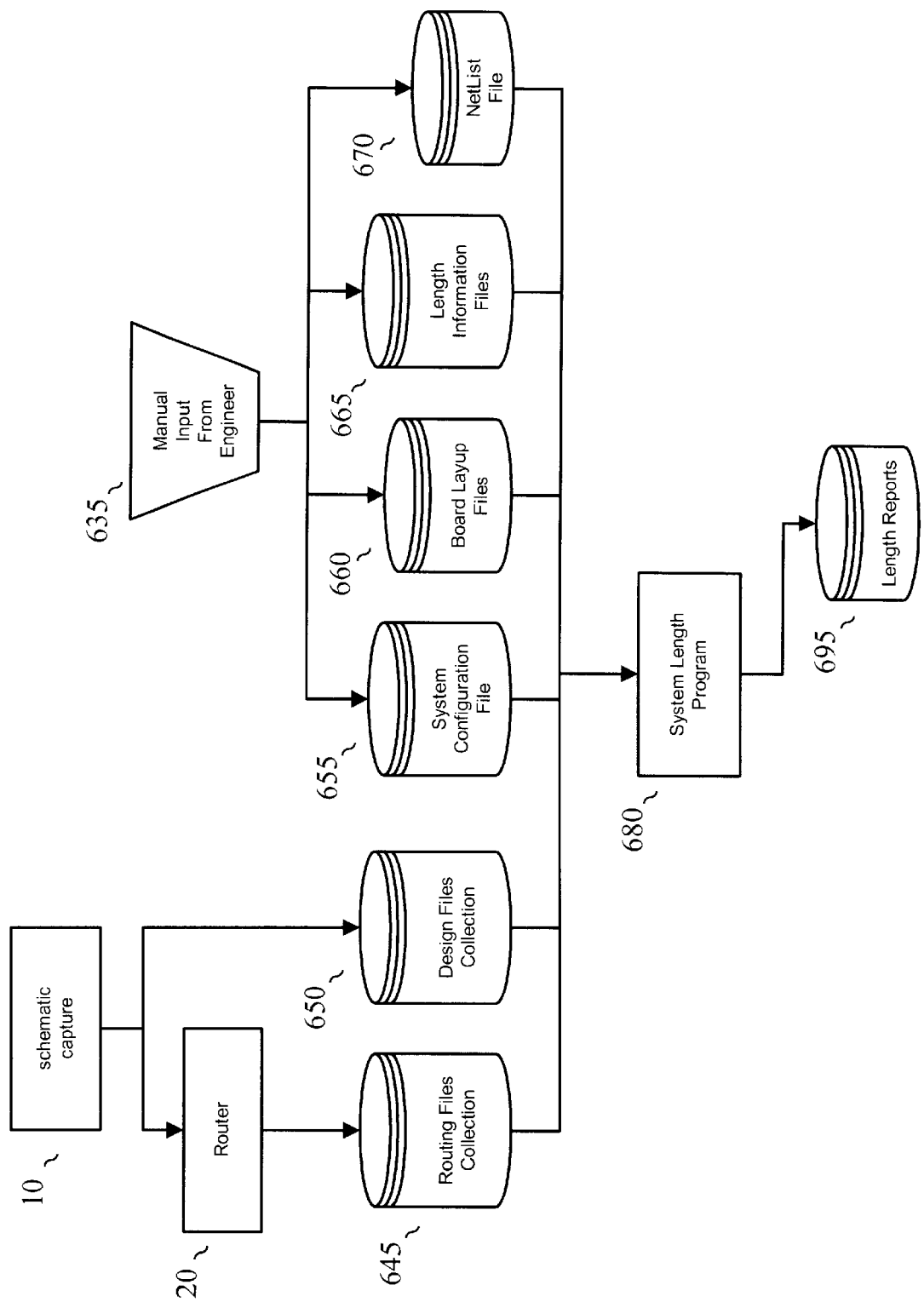
FIG. 6 shows another illustrative diagram embodying the principles of the invention.

As noted above, the above-described method provides a rough approximation of system signal path length—basically just including the foil lengths on the various layers of each PCB. However, this method can be further improved to include such items as, but not limited to, connector pin lengths, device (e.g., integrated circuit (IC)) bonding lengths, via lengths, etc. Turning now to FIG. 6, another illustrative diagram embodying the principles of the invention is shown. Like numbers indicate like elements and will not be described further. Turning first to steps 10 and 20 (as described above), for each of the N PCBs of the computer system a design file and a routing file are produced resulting in a design files collection 650 and a routing files collection 645. At this point, and in accordance with the inventive concept, a number of other files are created utilizing data collected, e.g., from each of the PCB board designers, in step 635. For illustration purposes the created files are in ASCII format and each is described below.

One such type of file is a length information file, of which there are at least two forms—a package length information file and a connector pin length information file. A package length information file is typically associated with a particular type of device package and provides the ability to associate a bonding length with a particular pin of a device. It is assumed that there is a mapping (not shown) of component (device) names (as listed in a design file) to a particular package type. Similarly, a connector pin length information file is typically associated with a particular type of electrical/physical connector and provides the ability to associate a length with a particular pin of a connector. (Connectors are shaped differently, and some pins may be physically longer than other pins of the same connector.) Thus, as described below, for each signal, PCB-specific signal path length calculations include not only any foil lengths on the various layers of a PCB, but also any length added by pins of individual device packages and associated connectors that are also coupled to the signal, etc. Whether or not a particular type of package or connector is of concern in determining a signal path length is a subjective design decision. As such, the inclusion of files of this type is not required. However, as system speeds continue to increase, parameters that previously could be ignored—may need to be considered.

Figure 8:
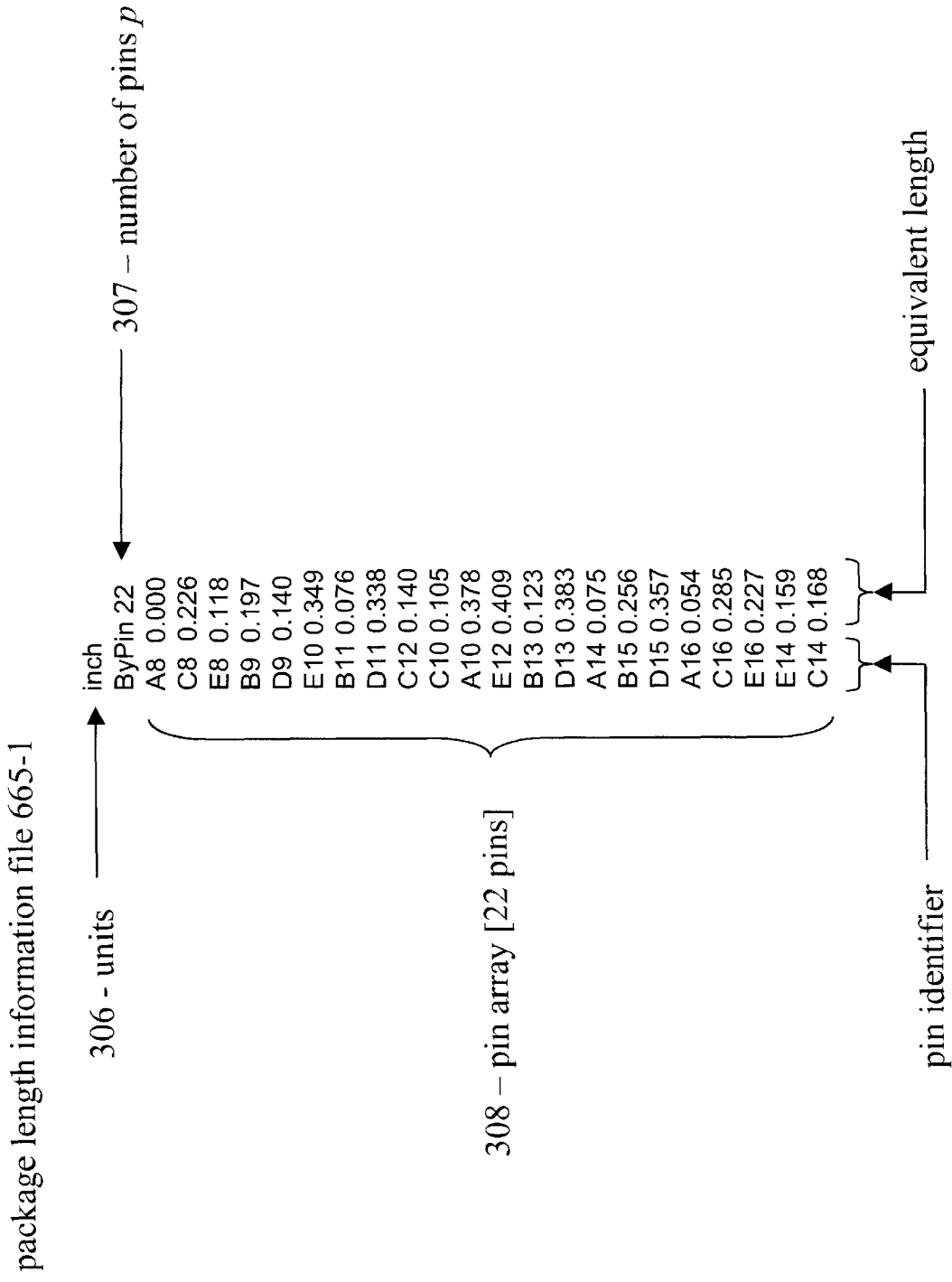

An illustrative format for a package length information file 665-1 is shown in FIG. 7. This file comprises a units field 306 (e.g., identifying the measurement type for any provided measurement values); a number of pins field 307, the value of which, p, is the number of pins associated with this package; and pin array field 308. The latter comprises at least a two dimensional array having at least 2 columns and p rows. Each row of the array comprising a pin identifier and an equivalent electrical length. As further illustration, an actual package length information file is shown in FIG. 8. It should be noted that equivalent electrical length values are calculated using known techniques (not described herein) and represent the device bonding lengths associated with this particular package.

Figure 10:
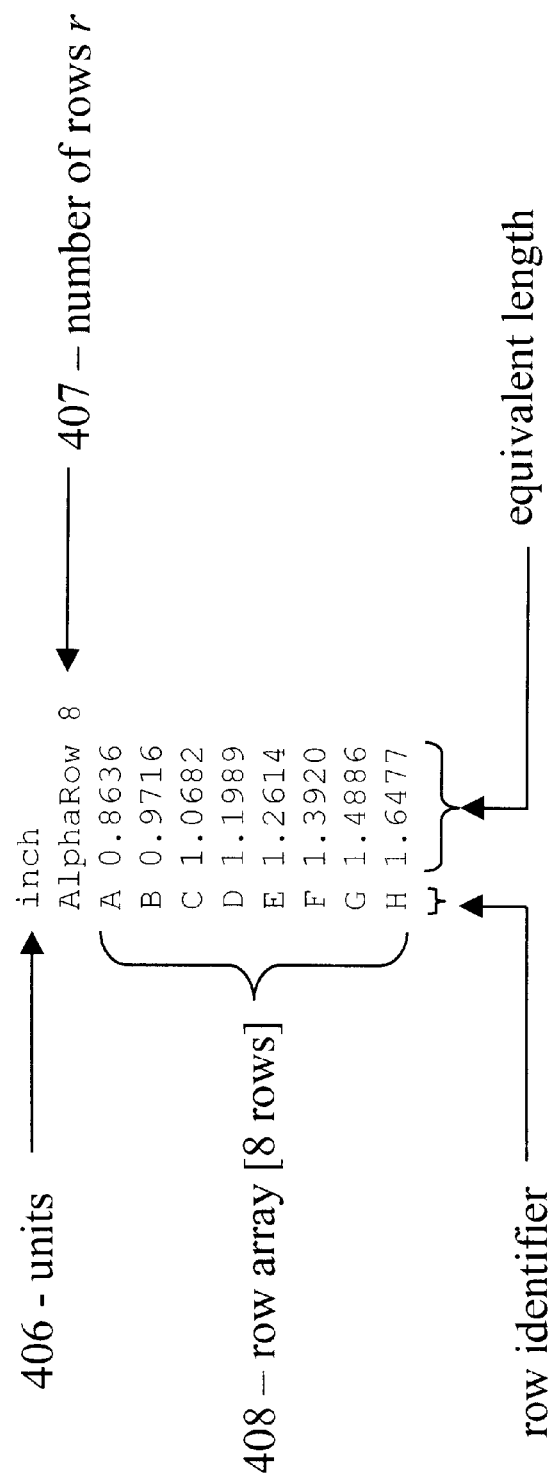

An illustrative format for a connector pin length information file 665-2 is shown in FIG. 9. This file comprises a units field 406 (e.g., identifying the measurement type for any provided measurement values); a number of rows field 407, the value of which, r, is the number of rows associated with this connector; and row array field 408. The latter comprises at least a two dimensional array having at least 2 columns and r rows, where each row further comprises a row identifier and an equivalent electrical length. (It should be noted that each pin of a connector could also be identified. However, it is often the case that rows of pins, each row comprising m pins, share the same electrical length. Hence, the simplification of this file to just identifying connector rows. All that is required is a mapping (not described herein) of a particular pin of a connector to the associated row.) As further illustration, an actual connector pin length information file is shown in FIG. 10. It should be noted that equivalent electrical length values are calculated using known techniques (not described herein).

Another type of file is referred to as a "board layup" file. The latter file is typically associated with a particular type of PCB and provides information comprising the number of layers, thickness of each layer, line width used on each layer and associated electrical impedance. Whether or not a particular type of PCB is of concern in determining signal path lengths is a subjective design decision. As such, the inclusion of files of this type is not required. (It should be noted that this file provides more detailed information than the above-mentioned PCB design file.)

Figure 12:
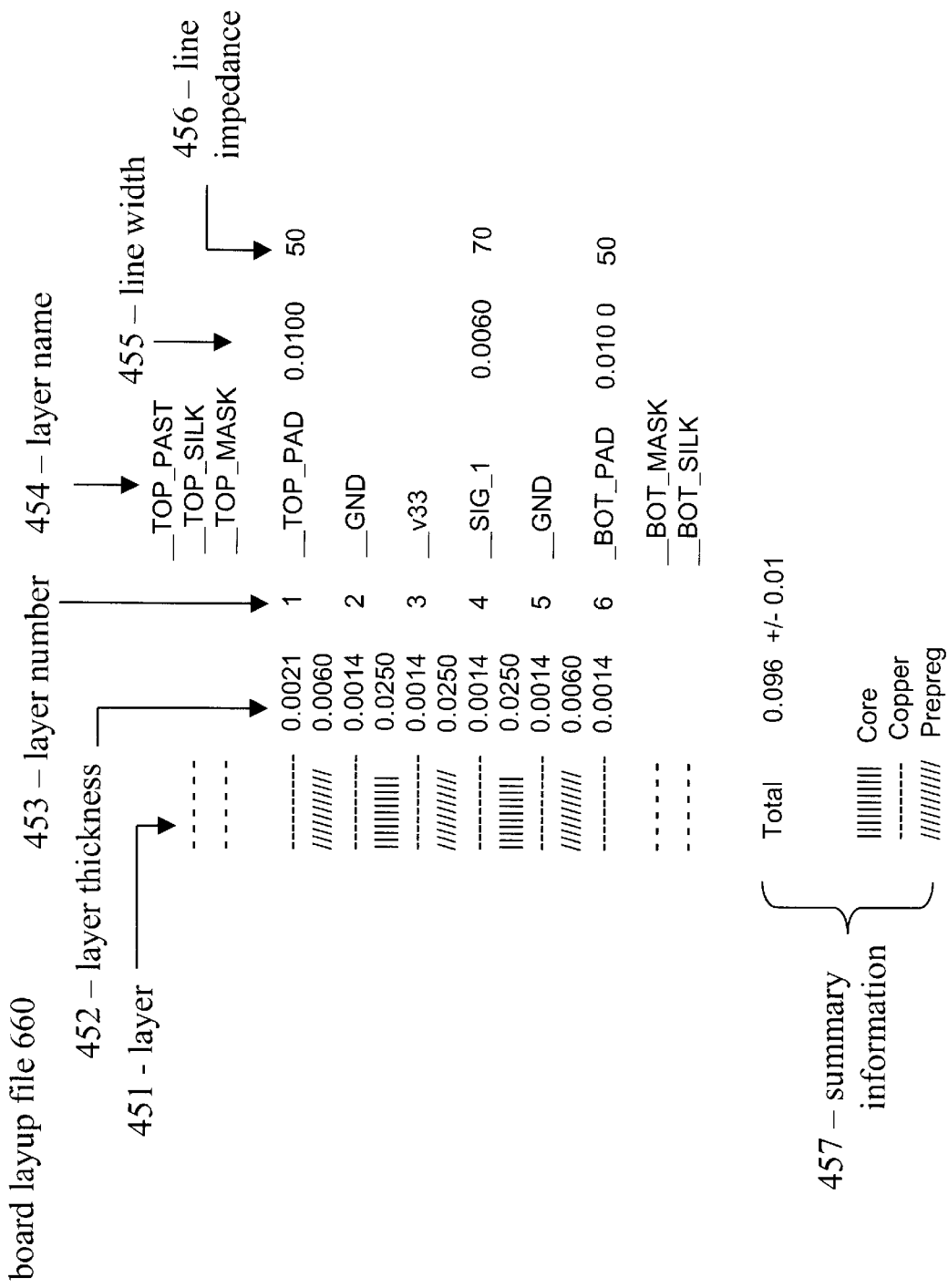

An illustrative format for a board layup file 660 is shown in FIG. 11. This file comprises, essentially, a table of information, where each row comprises fields for identifying the layer 451, the thickness 452, the layer number 453 (it should be observed that layer numbers are only associated with the conductive layers), the layer name 454, the line width 455 (again, only for those conductive layers of interest), and the electrical impedance 456 characteristic for the layers. Also included is summary information 457 comprising the total width of the board, and a legend for use in the layer column for identifying the various types of layers. As further illustration, an actual board layup file is shown in FIG. 12. It is assumed that the layer name is identical to the associated layer name used in the respective PCB routing file. Thus, e.g., it is possible to compute signal path length that includes the thickness of the PCB as a signal travels (through a via) from one conductive layer of the PCB to another conductive layer of the PCB. (It should be observed that signal length values in three dimensions are now being computed using such information.)

Another type of file is a system configuration file. The latter file is typically associated with a particular connecting-board, e.g., a backplane, or midplane, etc., into which other PCBs are inserted. This file provides physical configuration information for the system that, as described below, enables the tracing of a particular signal path through out the system. In other words, this file describes how the various PCBs of the computer system "fit together."

An illustrative format for a system configuration file 655 is shown in FIG. 13. System configuration file 655 comprises at least one connecting-board name 101 (representing the connecting-board, which comprises a number of slots into which various ones of the PCBs are inserted or plugged). In this example, it is assumed that the connecting-board name 101 is also illustratively a PCB (although this is not required). For each connecting-board name there is associated a board list 102 (i.e., the boards inserted into this connecting board) (described below), a connector map filename (which points to the file comprising additional connector information), a netsfile name (which provides groupings for signal paths in the computer system), and a filename associated with the board layup file (described above) for this connecting-board. Following the filename of the board layup file is a list of board type records (described below). In this example, there are k board type records, where k≦N. In other words, of the N PCB boards in the computer system, it is not required that each be unique. For example, 3 may be identical types and plugged into different slots of the connecting-board.

Turning to FIG. 14, an illustrative format for board list 102 is shown. Board list 102 comprises j records, where each record is associated with a PCB inserted into the connecting-board and j<N. (It can be observed that j is less than N in this example since the connecting-board itself is one of the N PCBs). Each record comprises a board type identifier, the name of the connector group into which the board for this record is inserted, the pin depth for this connector group and an identifier (for ease of reference) of the associated connector. (In this context, connector group is similar to board type, i.e., there may be 4 connectors (having different identifiers) that are located at different points of the connecting-board and that are of the same type, i.e., connector group, in the computer system.)

Also shown in FIG. 14 is an illustrative format for each board type record 103-i. Each board type record comprises information related to calculating critical lengths and comprises one, or more, of the following. Connector information comprising the name of the connector group that is used on the board, the associated pin depth for this connector group and an identifier (for ease of reference). Length information comprising any associated length information files (described above) along with an associated identifier (for ease of reference). Finally, an associated board layup file (described above). Thus, for each board type, information that is viewed as important to calculating a signal path length is included.

Figure 15:
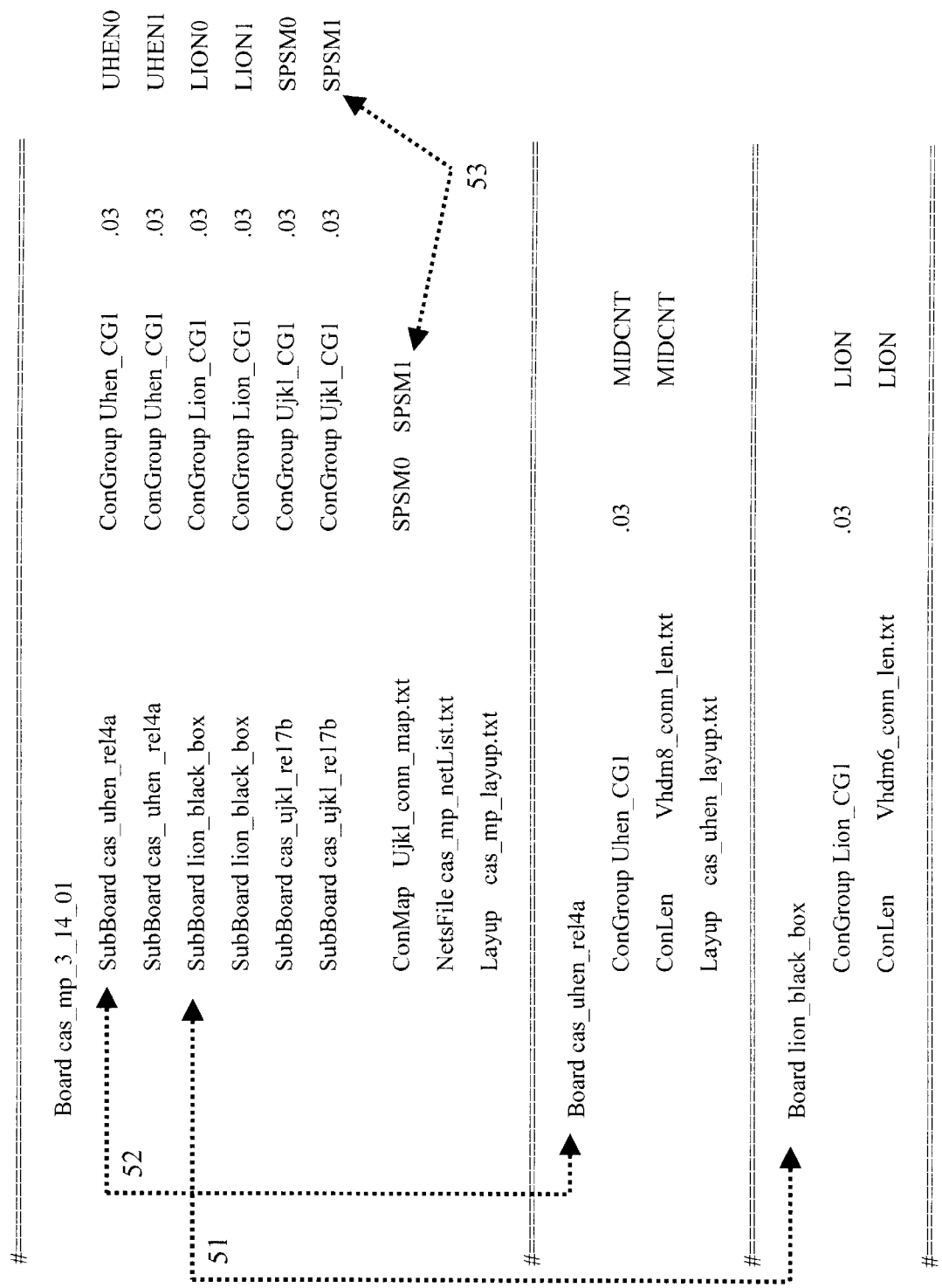

As further illustration, a portion of an actual system configuration file is shown in FIG. 15. In this example, the connecting-board (Board) name is "cas_mp_3_14_01."

The board list indicates four boards (SubBoards) plugged into it. The first board record identifies a board of type "cas_uhen_re14a" inserted into connector group (ConGroup) "Uhen_CG1" having a pin depth of 0.03 inches and actually inserted into connector associated with the identifier "UHEN0." It can be observed from the remaining entries in the board list that there is another board of type "cas_ohm_re14a" inserted into the connector associated with the identifier "UHEN1", that there are two boards of type "lion_black_box" inserted into connectors identified as "LION0" and "LION1," and that there are two boards of type "cas_ujkl_rel17b" inserted into connectors identified as SPSMO and SPSM1, respectively. The connector map (ConMap) file is "Ujkl_conn_map.txt" (which, in this example, relates to the connectors identified as SPSMO and SPSM1, as shown by dotted line 53), the netsfile file name is "cas_mp_netList.txt," and the board layup file (Layup) associated with this connecting-board is "cas_mp_layup.txt." Two board type records are also illustrated in FIG. 15, as shown by dotted lines 51 and 52, one for the "cas_uhen_re14a" board and one for the "lion_black_box" board. Each "cas_uhen_re14a" board has a connector of type "Uhen_CG1" with a pin depth of 0.03 inches associated with plugging into the mid-plane (here represented by the associated identifier MIDCNT). In addition, a connector pin length (Conlen) file "Vhdm8_conn_len.txt" (also associated with the mid-plane, re: MIDCNT) and a board layup file "cas_uhen_layup.txt" are indicated. For the "lion_black_box" board type there are similar entries (although it should be noted that there is no board layup file in this case). (A board layup file may not exist, e.g., because one is not deemed necessary, or the information required to create one is not available. The latter situation would occur, e.g., if the computer system used a board manufactured by another vendor, for which there is no detailed PCB information.)

Another type of file is a netslist file for the system. The netslist file is used to group signals of interest for the system. For example, a listing of the clock signals, and/or data signals, and/or address signals, etc. It should be noted that the signal names used should, preferably, be the same ones used by the above-mentioned design file and routing file.

Figure 17:
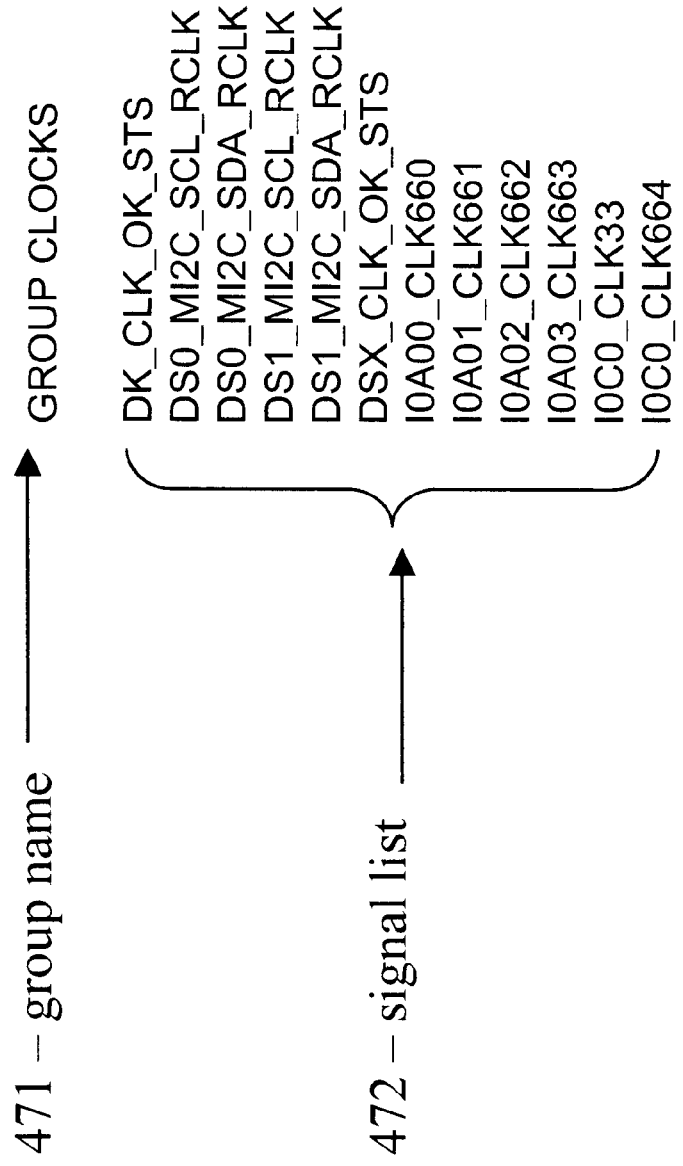

An illustrative format for a netslist file 670 is shown in FIG. 16. This file comprises, essentially, at least one grouping-of signal-related information, each group comprising a group name 471 and a list of signals 472 associated with that group. As further illustration, a portion of an actual netslist file is shown in FIG. 17.

Figure 18:
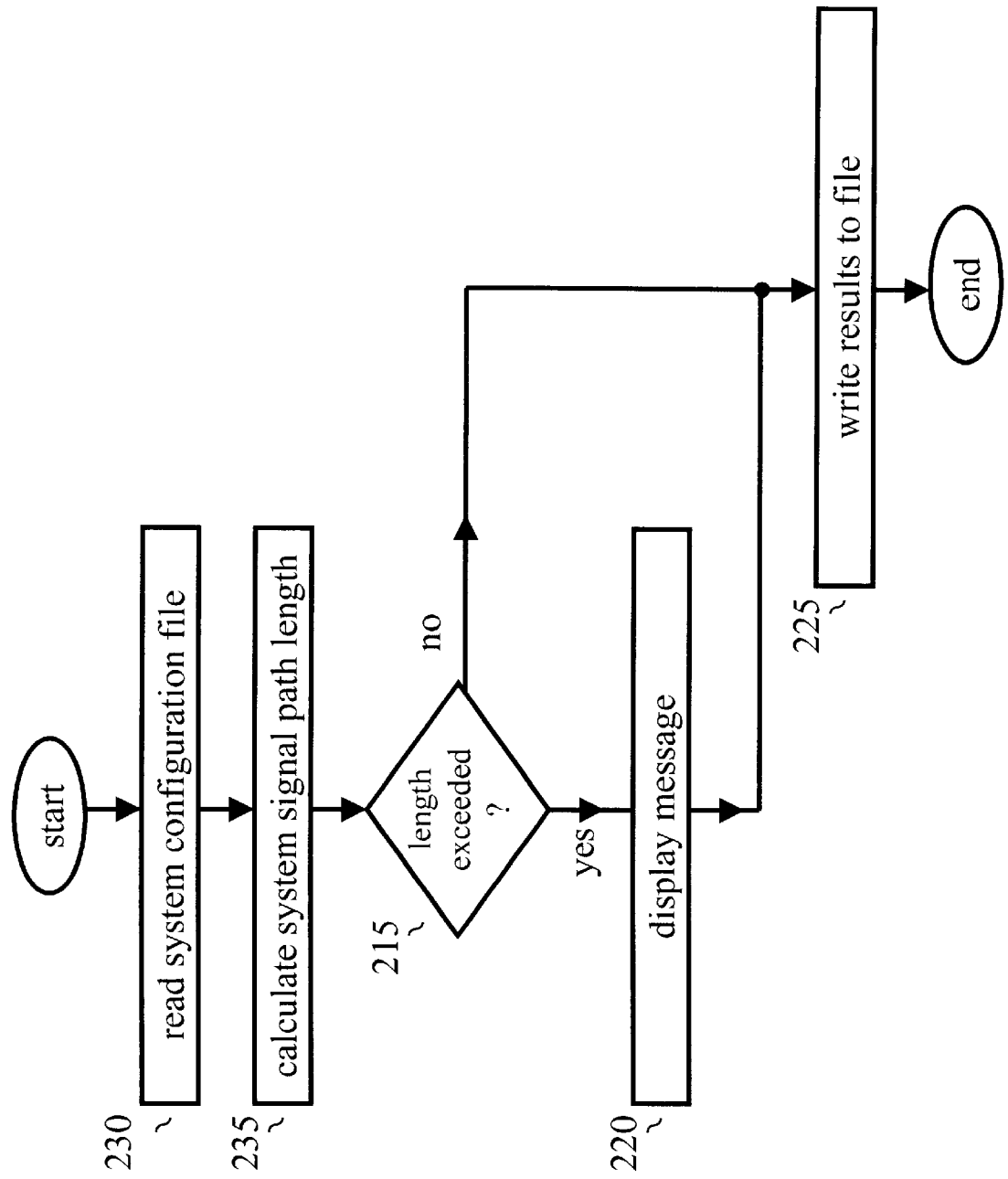
FIG. 18 shows another illustrative flow chart in accordance with the principles of the invention.

Turning to FIG. 18, in accordance with the invention, system length program 680 processes the various above-mentioned files (and illustrated in FIG. 6) to determine if a particular signal path exceeds a predefined signal path length for the system. Like numbers indicate like elements and are not described further. (It should be observed that either a consistent naming approach must be enforced across the system for identifying signal names, connector pins, etc., (e.g., a design engineer is required to use predefined signal names if they already exist); or mapping information (e.g., a conversion table) must be provided that allows one to associate a particular signal name on one PCB to its corresponding name on other PCBs. Similarly, it is assumed that each routing file identifies connector information consistently. For example, as a signal path exits a PCB to a particular-pin of a connector, that connector/pin identification is consistent through the computers system or, via a mapping process, can be converted from one identifier/label to another.)

In step 230, system length program 680 reads system configuration file 655. For each signal name identified in the associated netsfile, system length program 680 accumulates signal path length information. In particular, system length program 680 accumulates PCB-specific signal length information from routing files collection 645 (as described earlier) for each named signal path (i.e., from the associated netsfile). In addition, system length program 680 examines for each identified board in board list 102, of the system configuration file, the associated board type information for calculating additional signal path length values for those named signals from any identified connector information (e.g., associated pin length), length file(s) and/or board layup file. Similarly, for each board in board list 102, system length program 680 adds any additional signal path length value due to the identified connector group (e.g., the associated pin depth) for those named signals. The identified connector map information is processed. Finally, the board layup file for the connecting board itself is processed for any additional signal path length values. It should be noted that design files collection 650 provides additional information for use in calculating additional length value increments for any components (devices) associated with a particular package, e.g., the x, y location of a component and whether the component is on the top or bottom of a particular PCB.

Thus, the above-mentioned process provides—for a particular signal—the ability to take into account signal path length across the entire system. For example, from each PCB routing file (of routing files collection 645 of FIG. 6) it can be determined if the particular signal has a net on that PCB and the x and y information is used to determine signal path length. Further, from each PCB layup file (of board layup files 660) the width of various layers of the PCB is taken into account. Similarly, length information files 665 takes into account connector information and device length. Finally, system configuration file 655 provides the information as to how the PCBs are arranged in the system and netsfile 670 provides the signal names of interest.

As described earlier, step 215 checks if any signal exceeds its predefined system length. If a signal is determined to exceed its associated predefined system length in step 215, then a suitable error message (e.g., identifying the signal, its length by PCB, its system length, and the predefined system length for that signal) is displayed in step 220 (e.g., on a display of the work station). (If a system-level parameter, such as length, is exceeded, then, e.g., a particular PCB design can be altered to change the routing and the above-mentioned process repeated.) In either event, a length report file 695 is provided in step 225, where the length report lists, e.g., for each signal (net) name the associated rough approximation of signal path length. (Suitable exception handling can be added to system length program 30 to handle, e.g., those signals for which there is no limitation to system signal path length, etc.) Optionally, other statistical data can also be presented, such as, but not limited to, the average system length computed across all signal paths in a particular group, the maximum length, the minimum length and any delta for the group.

As another illustration of the inventive concept, a CAD tool takes into account a system-level design parameter, where the system-level design parameter represents a physical orientation of at least one signal path as the signal paths traverse a computer system comprising N PCBs, where N>1. In particular, the CAD tool processes at least N board-related data files comprising layout and signal path routing information for each PCB for creating a three-dimensional (3D) picture for showing how at least one signal path traverses the computer system in going from one PCB to another PCB. Such a capability is important in those systems where, e.g., as a signal bus moves from one PCB to another PCB, the signal bus cannot use "routing vias" (i.e., there is a predefined tolerance on the amount of physical "twist" in the signal paths). (A "routing via" (where a signal path moves from one layer to another) is different from a "breakout via" (where the signal path moves from, e.g., an IC to a layer. As known in the art, a twisting requirement is tied to desired signal propagation characteristics and minimum skew requirements for the signal.)

Figure 19:
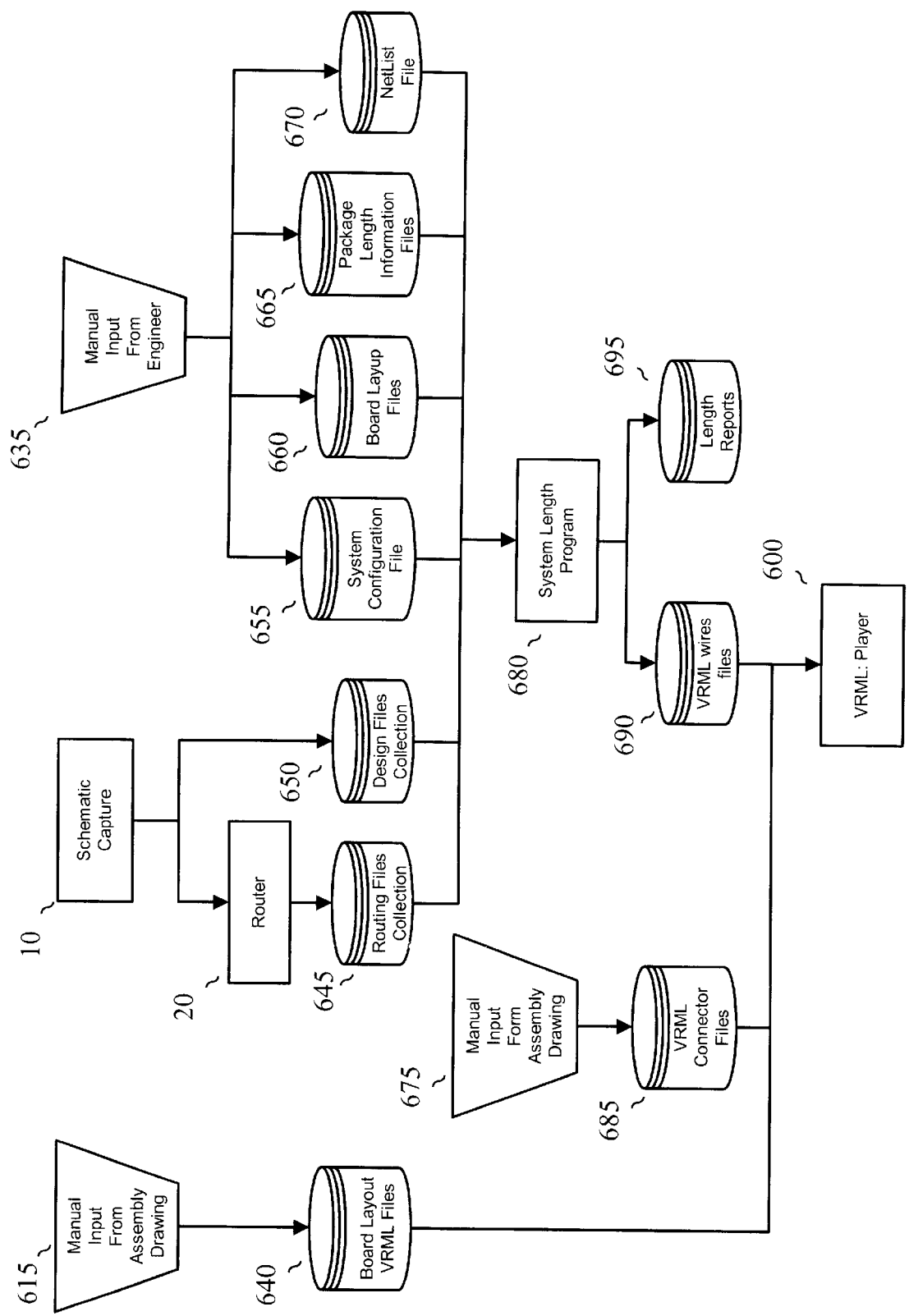
FIG. 19 shows another illustrative flow chart embodying the principles of the invention.

An illustrative diagram of a CAD tool providing a spatial view of signal paths in a computer system comprising N PCBs, where N>1, is shown in FIG. 19. Like numbers indicate like elements and will not be described further. Familiarity with the known Virtual Reality Modeling Language (VRML) 2.0 using the UTF-8 character set is assumed. VRML provides an easy-to-use syntax for defining lines, both as to their starting point, endpoint, width and orientation in an x, y, z axis (three dimensional (3D)). As can be observed from FIG. 19, a number of VRML files are created. These VRML files are used by VRML player 600 for the purpose of displaying, e.g., on a display of a computer system, a 3D representation of the computer system, both as to board placement and as to individual signal paths as they traverse the computer system. Thus, it is possible to follow a particular signal (or groups of signals) from one PCB to another PCB of the computer system and/or view board orientation in the system. One illustration of a VRML player is Microsoft Internet Explorer 5.0 configured with the Cosmo Player 2.1.1 plug-in, which is a free download for Windows-based platforms available from http://www.cai.com/cosmo.

For each PCB of the computer system, a board layout VRML file is created. This is created manually (element 615) and uses the length, width and thickness information from each PCB design file. Similarly, for each connector, a VRML connector file is created manually and uses available length, width and thickness information. (Other than the inventive concept, both a board layout VRML and a VRML connector are, in effect, representations of 3D polygons, e.g., a 3D rectangle, the creation of which from length, width and thickness information is known in VRML.) The system length program 680 (described with respect to FIG. 18) is modified to provide a set of VRML wires files for each named signal (netlist file 670). (Alternatively, a separate program could be created.) It is more efficient to modify system length program 680 since (as described above) it is already tracing each named signal through the system as it calculates the associated system signal path length. A portion of an illustrative VRML wires file 690-1 is shown in FIG. 20. VRML wires file portion 690-1 comprises a VRML macro definition 690-2, which, other than the inventive concept, is know in the art and not described herein. As can be observed from FIG. 20, as system length program 680 traces each signal through the computer system, it builds up the VRML wires file. For example, as the system length program 680 operates on a particular board (board cas_clk is illustrated in FIG. 20) for tracing a particular signal (signal (net) CLOCK_OK_STS is illustrated in FIG. 20) system length program 680 converts any x, y and z information into appropriate VRML commands as illustrated in FIG. 20. The linelocation and linesize entry values represent the midpoint of that particular line segment. The lineangle entries provide rotation information. (It should be observed that the above-described programs are executed in a windows environment. As such, it is assumed that a user interfaces to a program embodying the inventive concept utilizing known windows-type interface. For example, drop-down menus, etc. Tools for designing windows-style interfaces are known in the art.)

The following is an illustration for the structure of a "system" type file ("3d_system.wrl"), along with the files that it references, which can be used as an input to the above-mentioned Cosmo player.

---

(1) 3d_system.wrl
    Proto definitions
    View section for the system
    Midplane outline
    Container for midplane route data
    References to Connectors and boards that plug input the midplane,
        and has containers for each boards route data
        See (2) and (3)
    Code use to load and unload route file, and references to routes files
        See (6)
    DialogBox and Buttons for bus selections
    DialogBox and Buttons for Board selections
(2) Board_data_xxx.wrl Files-( xxx = board name )
    View section for the board
    Board outline
    Reference to the board connector Connector_xxx_bd.wrl
        See (4)
    Reference to the board asic Asic_xxx.wrl
        See (5)
(3) Connector_xxx_mp.wrl Files-( xxx = board name, connector for the midplane)
    Proto definitions
    View section for the connector
    Connector outline
    Connector pin layout section
(4) Connector_xxx_bd.wrl Files-( xxx = board name, connector for the board)
    Proto definitions
    View section for the connector
    Connector outline
    Connector pin and Guide layout section
(5) Asic_xxx.wrl Files-( xxx = board name that asic is used on, currently only one per board )
    Proto definitions
    View section for the asic
    Asic outline
    Asic pin layout section
(6) Wires_xxx.wrl Files ( xxx = group name )
    Proto definitions
    board route data

---

Figure 21:
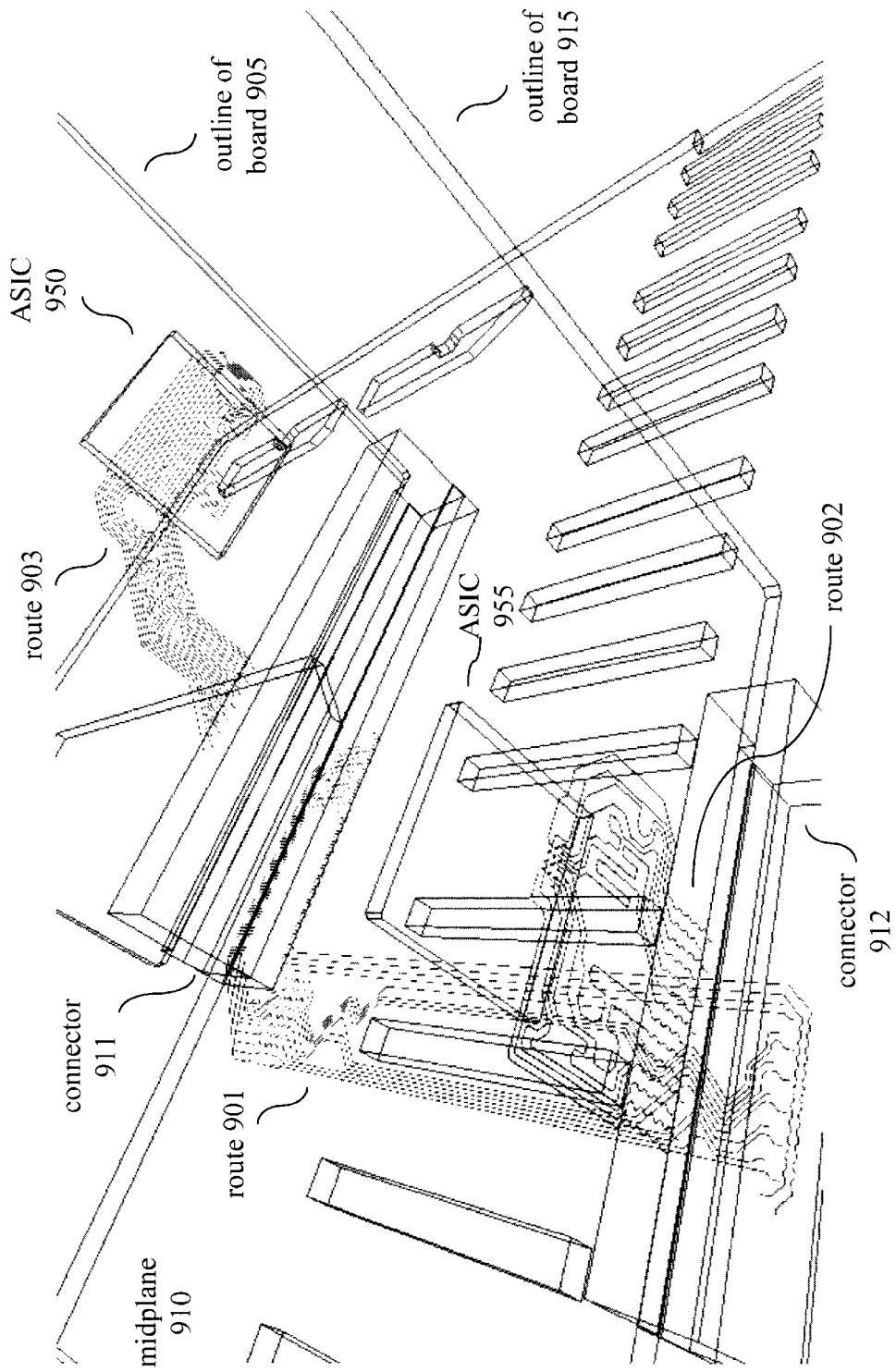
FIG. 21 shows an illustrative 3D view.

An illustrative 3D view (of a portion of a server) that can result from the above-described CAD tool is shown in FIG. 21. The latter shows an outline of a midplane 910 comprising at least two connectors 911 and 912. Board 915 (as illustrated by its outline) is inserted into connector 912, while board 905 (as illustrated by its outline) is inserted into connector 911. On board 915 is ASIC 955 (as illustrated by its outline), while ASIC 950 (as illustrated by its outline) is on board 905. As can be observed from FIG. 21, a visual image is provided for the signal paths going from ASIC 955 to ASIC 950, via route 902 (on board 915), route 901 (on midplane 910) and route 903 (on board 905).

As described above, the inventive concept provides an efficient mechanism to validate early in the design process whether various components of a system, when virtually combined in three dimensions, cause the system to not conform to a system-level design requirement.

Figure 22:
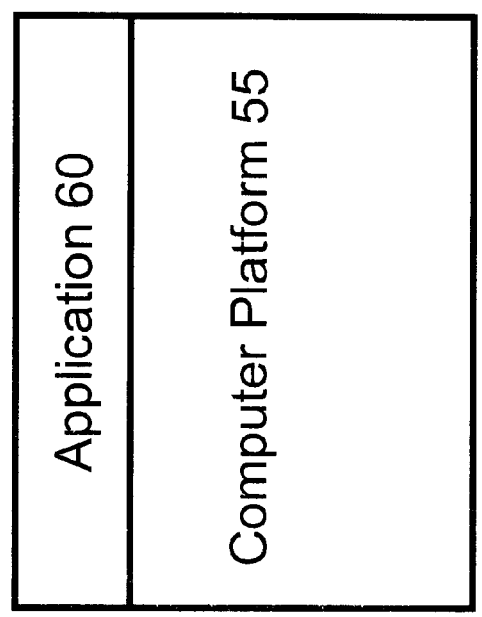
FIG. 22 shows an illustrative block diagram of a machine for use in accordance with the principles of the invention.

Turning briefly to FIG. 22, an illustrative block diagram of a machine for use in accordance with the principles of the invention is shown. Other than the inventive concept, the elements shown in FIG. 22 are well known and will not be described in detail. Work station 50 comprises an application 60 (which executes, e.g., the flow charts described above) residing on a computer platform 55, which is a stored-program-control based processor architecture including a processor, memory, display, keyboard, etc. It should be noted that the information in the above-described PCB-specific files can be compiled into a memory mapped file by application 60 (versus accessing, e.g., a hard disk for each and every file access). This provides fast access to the information—thus saving time when application 60 is re-executed to, e.g., re-compute a signal path length. Application 60 updates theses PCB-specific files only when information has changed, which, e.g., is detected by examining the system time and date stamp of the PCB-specific files.

The foregoing merely illustrates the principles of the invention and it will thus be appreciated that those skilled in the art will be able to devise numerous alternative arrangements which, although not explicitly described herein, embody the principles of the invention and are within its spirit and scope. For example, although the inventive concept was described in the context of computer system comprising a number of PCBs, it is also applicable to checking if any electrical system, comprising a number of individual components, meets system-level design parameters. Also, although only two illustrations of system-level design parameters were described, it should be realized that the inventive concept is not so limited and other system-level design parameters can be used. In addition, some steps can be further automated. For example, manual input 615 of FIG. 19 could be converted into a software program that uses the design file information for generating the board layout VRML files.

What is claimed:

1. A computer program product, readable by at least one machine, embodying a program of instructions executable by the at least one machine for performing a computer aided design (CAD) method, the method comprising the steps of:
    generating a plurality of individual printed circuit board (PCB) data files, the PCB data files representing PCBs of a computer system; and
    processing the plurality of individual PCB data files for taking into account a system-level design parameter of the computer system across more than one of said plurality of individual PCB data files.

2. The computer program product of claim 1 wherein the system-level design parameter is overall signal path length and each of said plurality of individual PCB data files comprises component layout and signal path routing information and wherein the processing step utilizes the component layout and signal path routing information from each of said plurality of individual PCB data file for determining if at least one signal path length including those which may cross from one PCB to another PBC, meets the overall signal path length system-level design parameter.

3. The computer program product of claim 2 wherein the PCBs of computer system comprise a Board and at least one SubBoard.

4. The computer program product of claim 1 wherein the system-level design parameter is overall signal path length and each of said plurality of individual PCB data files comprises component layout and signal path routing information and wherein the processing step utilizes the component layout and signal path routing information from each of said plurality of individual PCB data files along with data from a system configuration file, which provides information on bow each PCB is arranged in the computer system for determining if at least one signal path length including those which may cross from one PCB to another PBC, meets the overall signal path length system-level design parameter.

5. The computer program product of claim 1 wherein the system-level design parameter is a physical orientation of a signal path which path traverses the computer system from at least one PCB to another PCB and wherein each PCB data file comprises component layout and signal path routing information and wherein the processing step utilizes the component layout and signal path routing information from each PCB data file for displaying a three dimensional image of the signal path in the computer system.

6. The computer program product of claim 1 wherein the system level design parameter comprises at least one of a group of parameters consisting of:
   length, width, and thickness.

7. The computer program product of claim 1 wherein the system level design parameter comprises impedance.

8. The computer program product of claim 1 wherein the PCBs of a computer system comprise a Board and at least one SubBoard.

9. A computer-based method for use in computer aided design (CAD), the method comprising the steps of:
   generating a plurality of individual printed circuit board (PCB) data files, the PCB data files representing PCBs of a computer system; and
   processing the plurality of individual PCB data files for taking into account a system-level design parameter of the computer system across more than one of said plurality of individual PCB data files.

10. The computer-based method of claim 9 wherein the system-level design parameter is overall signal path length and each of said plurality of PCB data files comprises component layout and signal path routing Information and wherein the processing step utilizes the component layout and signal path routing information from each of said plurality of PCB data files for determining if at least one signal path length meets the overall signal path length system-level design parameter.

11. The computer-based method of claim 10 wherein the PCBs of a computer system comprise a Board and at least one SubBoard.

12. The computer-based method of claim 9 wherein the system-level design parameter is overall signal path length and each of said plurality of PCB data files comprises component layout and signal path routing information and wherein the processing step utilizes the component layout and signal path routing information from each of said plurality of PCB data files along with data from a system configuration file, which provides information on how each PCB is arranged in the computer system for determining if at least one signal path length meets the overall signal path length system-level design parameter.

13. The computer-based method of claim 9 wherein the system-level design parameter is a physical orientation of a signal path which path traverses the computer system from at least one PCB to another PCB and wherein each of said plurality of PCB data files comprises component layout and signal path routing information and wherein the processing step utilizes the component layout and signal path routing information from each of said plurality of PCB data files for displaying a three dimensional image of the signal path in the computer system.

14. The computer-based method of claim 9 wherein the system level design parameter comprises at least one of a group of parameters consisting of:
   length, width, and thickness.

15. The computer-based program of claim 9 wherein the system level design parameter comprises impedance.

16. The computer-based method of claim 9 wherein the PCBs of a computer system comprise a Board and at least one SubBoard.

* * * * *